(12) United States Patent
Chidambaram et al.

(10) Patent No.: US 7,202,537 B2
(45) Date of Patent: Apr. 10, 2007

(54) VERSATILE SYSTEM FOR LIMITING ELECTRIC FIELD DEGRADATION OF SEMICONDUCTOR STRUCTURES

(75) Inventors: Periannan Chidambaram, Richardson, TX (US); Greg C. Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/180,149

(22) Filed: Jul. 13, 2005

(65) Prior Publication Data

US 2005/0260858 A1 Nov. 24, 2005

Related U.S. Application Data

(63) Continuation-in-part of application No. 10/850,751, filed on May 21, 2004, now Pat. No. 7,101,751.

(51) Int. Cl.
 *H01L 29/76* (2006.01)
(52) U.S. Cl. ..................................... 257/371
(58) Field of Classification Search ............... 257/162, 257/355, 200, 369–371, 68
 See application file for complete search history.

(56) References Cited

U.S. PATENT DOCUMENTS 5,432,366 A * 7/1995 Banerjee et al. ............ 257/327
6,864,533 B2 * 3/2005 Yasuhara et al. ........... 257/342
6,878,976 B2 * 4/2005 Coolbaugh et al. ......... 257/183
7,078,787 B1 * 7/2006 Bulucea ..................... 257/595
7,084,477 B2 * 8/2006 Ishitsuka et al. ............ 257/501
7,091,556 B2 * 8/2006 Edwards et al. ............ 257/336

\* cited by examiner

*Primary Examiner*—Nathan W. Ha
(74) *Attorney, Agent, or Firm*—Rose Alyssa Keagy; W. James Brady; Frederick J. Telecky, Jr.

(57) ABSTRACT

The present invention provides a system for limiting degradation of a first semiconductor structure (304) caused by an electric field (314), generated from within the semiconductor substrate (302) by high voltage on a second semiconductor structure (310). A semiconductor device (300) is adapted to reduce the effective magnitude of the field—as realized at structure 304—to some fractional component (320), or to render the angle (322)—at which the field approaches the first structure through a first substrate region (306)—acute. Certain embodiments of the present invention provide for: lateral recession of the first semiconductor structure to abut an isolation structure (312), which is disposed between the second semiconductor structure and the first substrate region; lateral recession of the first semiconductor structure from the isolation structure, so as to form a moat therebetween; and a counter-doped region (316) within the first substrate region.

7 Claims, 2 Drawing Sheets

VERSATILE SYSTEM FOR LIMITING ELECTRIC FIELD DEGRADATION OF SEMICONDUCTOR STRUCTURES

This is a division of application No. 10/850,751, now U.S. Pat. No. 7,101,751 filed May 21, 2004, the entire disclosure of which is hereby incorporated by reference.

TECHNICAL FIELD OF THE INVENTION

The present invention relates generally to the field of semiconductor devices and, more particularly, to apparatus and methods for limiting degradation of semiconductor device structures caused by electric fields.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size and, correspondingly, smaller device geometries.

As semiconductor feature sizes and geometries are reduced, certain device structures become more sensitive to physical properties and behaviors of other nearby device structures. Minor changes in placement or configuration of a device structure can have a significant impact on the lifetime performance or reliability of an integrated circuit. Balancing competing sensitivities and characteristics of different structures within a circuit can be further complicated by technology-imposed design or layout limitations. A number of high-performance device fabrication technologies must impose certain design constraints (e.g., maximum interconnect width, maximum oxide thickness, minimum gate length) in order to provide required performance levels (e.g., low voltage operation).

Consider, for example, certain issues that arise during the production and operation of low voltage CMOS transistor devices. The use of low supply voltage (e.g., 1.2V, 1.8V) CMOS components within certain applications—especially applications where such components are interfaced to higher voltage (e.g., 1.8V, 3.0V) devices—can result in disproportionately high stresses on critical CMOS features and structures. One CMOS device feature of particular concern is gate oxide. The electrical integrity and stability of gate oxide structure is critical to overall transistor performance and reliability. However, CMOS transistor gate oxides can be vulnerable to structural and parametric breakdown caused by high electric fields generated from within a transistor—especially relatively shallow gate oxides that are common in low voltage technologies.

Such internally generated electric fields frequently occur where a low supply voltage CMOS transistor is utilized in an application having high transistor terminal bias voltages (i.e., high bias on either the transistor's drain or supply). Unfortunately, such applications are commonplace for CMOS transistors. In many cases, it is desirable to design a system incorporating as many low supply voltage devices as possible, even where those low supply voltage devices must be used in conjunction with relatively high signal voltage devices.

Moreover, the generation of, and damage caused by, internal electric fields can be intensified by device features and spatial relationships necessitated by the device's fabrication technology. For example, a number of small geometry CMOS transistor technologies utilize a shallow trench isolation (STI) feature within device silicon to separate gate structure from drain structure. Commonly, however, the configuration and placement of STI features conduct, or promote the conduction of, electric fields from the drain region orthogonally into the gate oxide.

As most, if not all, of an orthogonal electric field penetrates a gate oxide, that oxide rapidly begins to break down. As gate oxide breakdown continues, device parametric performance skews drastically until the device fails completely. This obviously causes a number of circuit and system performance and reliability problems. A manufacturer's ability to address such phenomena, and problems resulting therefrom, is often limited or precluded by process technology design constraints. In a low voltage technology, for example, increasing gate oxide thickness to withstand electric field degradation is often not possible or commercially feasible. Altering process flows or design rules, to overcome such technology-imposed constraints on a general or case-by-case basis, is inefficient and cost-prohibitive.

As a result, there is a need for a system that effectively limits semiconductor structure degradation caused by internally generated electric fields—improving overall circuit and system performance and reliability in an easy, efficient and cost-effective manner.

SUMMARY OF THE INVENTION

The present invention provides a versatile system, comprising a number of apparatus and methods, for limiting degradation of semiconductor device structures caused by electric fields in a commercially viable manner. Comprehending certain complications caused by internally generated electric fields, and certain limitations and restrictions inherent in certain commercially viable semiconductor process technologies, the system of the present invention effectively limits electric field degradation through process-compatible manipulations of semiconductor feature composition and relative positioning. The system of the present invention modifies the conductivity of certain semiconductor features. In certain cases, the conductivity of a region—through which internally generated electric fields pass—is reduced, decreasing the magnitude and effect of the field on a critical device structure. The present invention also provides modified conductivity to selectively alter or divert the path of internally generated electric fields. The diverted electric fields approach critical device structures along incidental, rather than orthogonal, vectors.

As a result, a semiconductor device feature is subjected to only a fractional portion of the electric field—significantly reducing the extent and rate of degradation that might otherwise occur from exposure to a full field. The present invention thus improves device performance and reliability—without requiring significant design rule or process modifications—in an easy, efficient and cost-effective manner. The present invention further provides low supply voltage devices suitable for implementation in high signal voltage applications.

Specifically, the present invention provides a system for limiting degradation of a first semiconductor structure caused by an electric field that is generated from within the semiconductor substrate by high voltage on a second semiconductor structure. A semiconductor device may be adapted to render the angle at which the field approaches the first structure through a first substrate region acute. Alternatively, or in combination, a semiconductor device may be adapted to alter the conductivity of certain semiconductor regions through which the field passes. Certain embodiments of the present invention provide for: lateral recession of the first semiconductor structure to abut an isolation structure, which is disposed between the second semiconductor structure and the first substrate region; lateral recession of the first semiconductor structure from the isolation structure, so as to form a moat therebetween; and a counter-doped region within the first substrate region.

More specifically, one embodiment of the present invention provides a method of producing a semiconductor device segment, adapted to reduce charge potential produced across a first semiconductor device structure by an electric field originating from a second semiconductor device structure. The method provides: a substrate; the first semiconductor device structure, disposed along the substrate; and the second semiconductor device structure, disposed along the substrate. The electric field's conductive path within the semiconductor device segment is altered, such that only a fractional portion of the electric field approaches the first semiconductor device structure.

Another embodiment of the present invention provides a low voltage semiconductor device segment, comprising a substrate having a channel region disposed along a first surface of the substrate. A terminal structure is disposed along the first surface of the substrate. An isolation structure is also disposed along the first surface of the substrate, in between the channel region and the terminal structure. An oxide structure is disposed atop the first surface of the substrate over the channel region. The semiconductor device segment is adapted to alter conduction of an electric field from the terminal structure to the oxide structure.

The present invention further provides a method of producing a low voltage CMOS transistor. A substrate is provided, having a first terminal structure disposed along the substrate. A second terminal structure, formed of a terminal material type, is disposed along the substrate. A channel region, formed of a channel material type, is disposed along the substrate in between the first and second terminal structures. An isolation structure is disposed along the substrate in between the second terminal structure and the channel region. A gate oxide structure is disposed atop the substrate over the channel region, having an edge recessed from the isolation structure so as to form a moat therewith. A counter-doped region is also provided, disposed within the channel region at the moat, formed of terminal material type.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1:
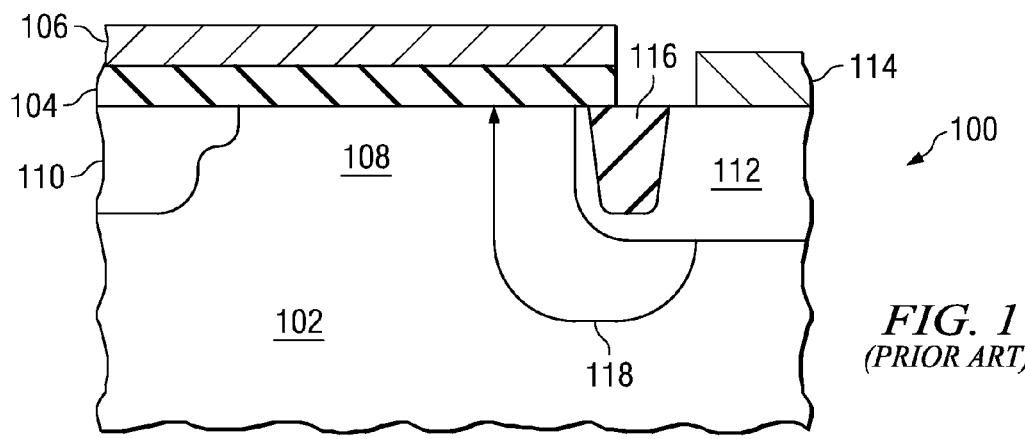
FIG. 1 provides an illustration depicting a PRIOR ART semiconductor device design without benefit of the present invention.

While the making and using of various embodiments of the present invention are discussed in detail below, it should be appreciated that the present invention provides many applicable inventive concepts, which can be embodied in a wide variety of specific contexts. The present invention is hereafter illustratively described primarily in conjunction with the formation of NMOS type semiconductor devices and structures, although it is generally applicable to any CMOS semiconductor application. The teachings and embodiments of the present invention may be utilized for PMOS and any other type of semiconductor device or structure that is capable of implementing such teachings and embodiments in a beneficial manner. The specific embodiments discussed herein are, therefore, merely demonstrative of specific ways to make and use the invention and do not limit the scope of the invention.

The present invention provides a versatile system in which certain physical characteristics of semiconductor devices or structures are manipulated—within constraints imposed by the semiconductor process technology—to significantly reduce or obviate the damaging effects of internally generated electric fields. Implementation of the present invention, in most cases, requires no modification of process design rules and minimal, if any, additional fabrication overhead. The present invention thus addresses issues of concern in a commercially viable manner.

The system of the present invention effectively limits the effects of electric field degradation through process-compatible manipulations of semiconductor feature composition, and relative positioning thereof. The system of the present invention modifies the conductivity of certain semiconductor features to alter the conduction path of internally generated electric fields. Through such alteration, overall magnitude of a field may be reduced, either by impeding the conduction of the field through a given area, or by diverting the conduction path of the field. Diverted electric fields approach critical device structures along incidental, rather than orthogonal, vectors. As a result, a critical device structure is subjected to only a fractional portion of the electric field—significantly reducing the extent and rate of degradation that might otherwise occur from exposure to a full field. The present invention thus reduces reliability issues associated with, and improves the operable lifetime of, a semiconductor device.

Although the present invention may be utilized to the benefit of a number of device structures and features, it is useful—for the purposes of illustration and explanation—to consider the present invention in relation to the formation and performance of a CMOS gate oxide within a transistor structure. As previously indicated, the electrical integrity and stability of gate oxide structure is critical to the overall performance and reliability of a CMOS transistor, and the semiconductor device or circuit incorporating that transistor.

Generally, gate oxide structures in high performance, low voltage technologies are constrained to a relatively shallow range (e.g., ~15–30 nm, for 1.8 V supply). Such structures are capable of withstanding some maximum operational voltage potential over the lifetime of the device, and thus have certain operational limits that are rated accordingly. Stressing the gate oxide in excess of the maximum potential can lead to physical or electrical break down of the oxide. Break down potentially results in degradation of the parametric performance of the transistor, shortening of the operational lifetime of the device, or complete device failure.

Usually, thicker gate oxides are capable of withstanding higher voltage potentials. In most low voltage technologies, however, increasing the relative depth of gate oxide to withstand high voltage potential is typically not possible or commercially feasible. Increasing gate oxide depth can add substantial material and overhead costs to production processes. Although high voltage performance levels provided by low voltage devices would—in most cases—be optimal, design and feature limitations (e.g., oxide thickness) imposed by certain semiconductor processes can force manufacturers into a tradeoff between production costs and reliability.

Many applications require the interface of low supply voltage CMOS components to higher voltage devices. In such applications, a low-voltage CMOS transistor may be utilized such that high transistor terminal bias voltage—i.e., high bias on either the transistor's drain or supply, depending upon MOS type—is continuous or reoccurring. Such is high bias results in strong internal electric fields flowing from the terminal area into the gate area of the transistor. The relative strength of such fields, and the degree of their penetration into a gate oxide structure, can significantly raise the voltage potential across the gate oxide and induce the aforementioned degradation effects. Furthermore, transistor features and spatial relationships necessitated by the device's fabrication technology can intensify to damage caused by such fields. In a number of cases, small geometry CMOS transistor technologies utilize device features and structures that conduct, or promote the conduction of, the internally generated electric fields into the gate oxide in an orthogonal or nearly orthogonal manner. The gate oxide structure thus bears most, if not all, potential of the electric field.

At this point, for purposes of explanation and illustration, it is useful to understand these phenomena in reference to an illustrative prior art process—one without benefit of the present invention. Referring now to FIG. 1, a representative prior art semiconductor segment 100 is depicted. For purposes of explanation and illustration, segment 100 is depicted and described as an NMOS type transistor segment. Segment 100 comprises a semiconductor substrate 102, upon which a gate oxide structure 104 is disposed. A polysilicon gate 106 is disposed atop the gate oxide 104. Substrate 102 comprises a channel region 108, doped as a P-type well. Substrate 102 further comprises a first terminal region 110, doped as N-type. In segment 100, region 110 functions as the transistor's source. Substrate 102 also comprises a second terminal region 112, doped as N-type. An electrical contact structure 114 (e.g., metallic contact) is disposed atop an outer portion of region 112. In segment 100, region 112 and structure 114 function as the transistor's drain. Segment 100 is fabricated in a small geometry CMOS transistor technology that utilizes a shallow trench isolation (STI) feature or structure 116 (e.g., isolation oxide) within device 100 to separate, for contact purposes, channel 108 (i.e., the gate structure) from the drain structure 114.

As the voltage potential of the drain structure surpasses the voltage potential of the gate structure, an electric field 118 is induced within substrate 102—flowing generally from an area beneath contact 114 toward the portion of oxide 104 atop region 108. The intensity of field 118 varies proportionally with the voltage differential between the drain structure and the gate structure. As the voltage potential at contact 114 increases, the magnitude of field 118 increases. The heavy P-type doping of region 108 renders it significantly more conductive than structures 112 or 116—facilitating or augmenting the progress of field 118 through substrate 102. Field 118 typically flows along the most conductive path—in this case, a direct vector path toward the drain structure, and oxide 104. Although it may vary depending upon the specific configuration of structures 112 and 116, the vector along which field 118 proceeds to and penetrates through oxide 104 is usually orthogonal or nearly orthogonal to oxide 104. Consequently, oxide 104 is subjected to some portion (i.e., most, if not all) of the potential force of field 118. The portion of field 118 which oxide 104 is subjected varies with the sine of the angle of incidence between oxide 104 and field 118. This raises the potential across oxide 104 past its maximum rated limits—inducing break down of the oxide. This degradation of the oxide alters the parametric performance, shortens the operational lifespan, or causes complete failure of the device.

The ability of designers to address such issues is usually restricted by certain performance and process limitations imposed by the technology. Increasing the depth of oxide 104, in order to withstand the potential introduced by field 118 without breaking down, may be infeasible or impossible within a typical low voltage fabrication process. Furthermore, significant alteration of the gate oxide depth may cause an unacceptable shift in certain parametric values for the device. Moreover, the presence and use of certain device features—such as structure 116—are often constrained by the low voltage nature of the technology.

In contrast, a system according to the present invention exploits certain physical properties and relationships within semiconductor devices and fabrication processes to alter the conductivity of certain semiconductor features or regions. Conductivity is adapted to reduce or otherwise impede conduction of an electric field, diminishing the effective magnitude of the field as it approaches and penetrates a critical device feature or structure (e.g., gate oxide). A system according to the present invention further exploits certain physical properties and relationships within semiconductor devices and fabrication processes to reduce the angle of incidence at which an electric field approaches and penetrates a critical device feature or structure. As the angle of incidence is reduced from orthogonal or nearly orthogonal to some lesser, acute angle, the sine component of the electric field decreases correspondingly. Utilizing this invention, the field-induced potential across a critical structure may thus be altered or controlled to remain below break down level. Once break down is averted, certain previously presented device performance and reliability issues are eliminated.

In reference to the illustrative low-voltage transistor example, a system according to the present invention may be adapted to: exploit certain physical properties and relationships to reduce the angle of incidence at which an electric field approaches and penetrates gate oxide; exploit certain physical properties and relationships to diminish the effective magnitude of an electric field, as realized at a gate oxide; or to combine both such approaches to reduce the magnitude and angle of incidence of an electric field. The system of the present invention addresses related performance and reliability issues without relying on increased gate oxide depth. Furthermore, the system of the present invention is adaptable to a number of device geometries and configurations—reducing electric field effects regardless of the presence of requisite semiconductor structural features (e.g., STI structures).

As a conductive path—along which an electric field flows—is rendered less conductive, the effective magnitude of the electric field—as realized at a gate oxide—is also reduced. Additionally, as an electric field's angle of incidence is reduced from orthogonal or nearly orthogonal to some lesser, acute angle, the sine component of the electric field decreases correspondingly, decreasing the effective magnitude of the field passing into the gate oxide. Reducing the effective magnitude of the electric field, and the charge potential introduced thereby, decreases the stress on the gate oxide and oxide break down is averted.

Figure 2:
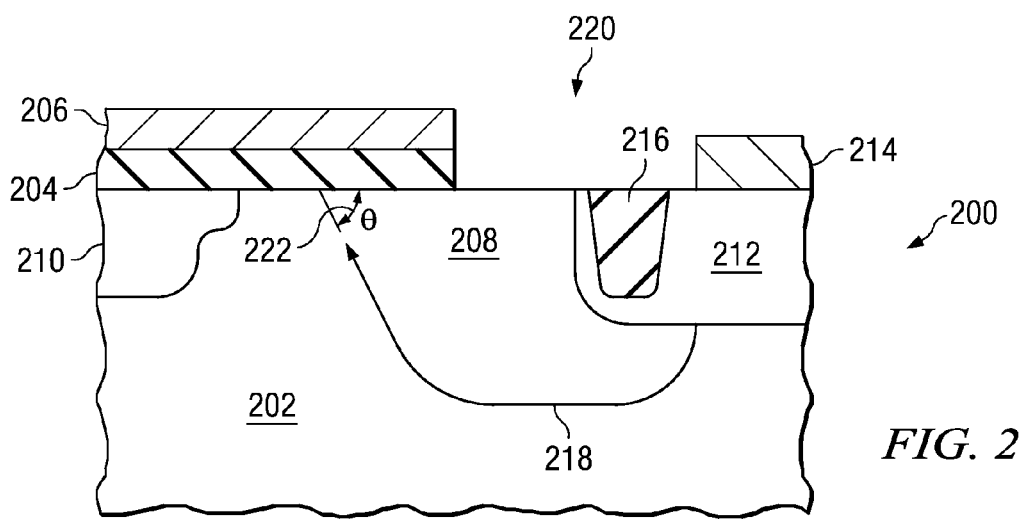
FIG. 2 provides an illustration depicting one embodiment of a semiconductor device design in accordance with certain aspects the present invention.

Certain aspects of a system according to the present invention are illustrated now in reference to a semiconductor device segment 200, as depicted in FIG. 2. In general terms, structural geometries and feature positioning within segment 200 is exploited to alter electric field incidence angles according to the present invention. For purposes of explanation and illustration, segment 200 is depicted and described as an NMOS type transistor segment. Segment 200 comprises a semiconductor substrate 202, upon which a gate oxide structure 204 is disposed. A polysilicon gate 206 is disposed atop gate oxide 204. Substrate 202 comprises a channel region 208, doped as a P-type well. Substrate 202 further comprises a first terminal region 210, doped as N-type. In segment 200, region 210 functions as the transistor's source. Substrate 202 also comprises a second terminal region 212, doped as N-type. An electrical contact structure 214 (e.g., metallic contact) is disposed atop an outer portion of region 212. In segment 200, region 212 and structure 214 function as the transistor's drain. Segment 200 is fabricated in a small geometry CMOS transistor technology that utilizes a shallow trench isolation (STI) feature or structure 216 (e.g., isolation oxide) within device 200 to separate, for contact purposes, channel 208 (i.e., the gate structure) from the drain structure 214.

When a high voltage is applied to the contact structure, and its voltage potential surpasses the voltage potential of the gate structure, an electric field 218 is induced within substrate 202—generally originating and flowing from an area beneath contact 214 toward the portion of oxide 204 atop region 208. The intensity of field 218 varies proportionally with the voltage differential between the drain structure and the gate structure. As the voltage potential at contact 214 increases, the magnitude of field 218 increases. The heavy P-type doping of region 208 renders it significantly more conductive than structures 212 or 216—facilitating or augmenting the progress of field 218 through substrate 202. Field 218 typically flows along the most conductive path—in this case, a direct vector path toward the drain structure, and oxide 204.

In contrast to the system illustrated in FIG. 1, however, segment 200 is formed having oxide 204—and, correspondingly, poly 206—laterally recessed, in the direction of region 210, from atop structure 216. In the embodiment depicted by segment 200, oxide 204 is sufficiently recessed from atop structure 216 so as to form moat 220.

The recession of oxide 204 is provided utilizing any suitable semiconductor process (e.g., masking, etch) or combination of processes. The size (i.e., breadth) of moat 220 may be varied, depending upon a number of design considerations (e.g., the maximum lateral variance permitted by the semiconductor fabrication process, parametric performance impact). In most such embodiments, however, moat 220 is formed of a dimension (e.g., ~5–10 nm) sufficient to effect and optimize a balance between such considerations and reduction of the angle of incidence of field 218, in accordance with the present invention. For most low voltage technologies, a small-scale recession of gate oxide 204 results in unappreciable, if any, shifts in overall parametric performance of a transistor.

Operationally, however, the recession of oxide 204 significantly alters the impact of field 218. Effectively, the recession of oxide 204 moves the target of field 218—changing the approach and penetration angle of field 218, with respect to oxide 204, from orthogonal or nearly orthogonal to some lesser, acute angle 222 ($\theta$). As a result, only a fraction of field 218—the sin ($\theta$) component of field 218—penetrates oxide 204 orthogonally. The potential induced across oxide 204 by field 218 is significantly lower than actual full potential of field 218. The resulting rate and extent of oxide degradation, due to field 218, is decreased dramatically or eliminated altogether.

In alternative embodiments, oxide 204 may either be required or desired to have lateral recession to a point where it only abuts, but does not overlap, structure 212 or 216. Such an embodiment may be required where the semiconductor fabrication process does not accommodate formation of moat 220, or where the recession of oxide 204 to form moat 220 has too great an impact on parametric performance of the device. An abutting oxide embodiment may be desired to preclude certain deleterious effects of silicide formation in relation to moat 220, as described hereinafter. Such an abutting oxide embodiment still reduces approach angle 222 to some acute value, providing the beneficial effects related to reducing degradation of oxide 204. These positive effects may be enhanced in conjunction with other embodiments and aspects of the present invention, as described hereinafter.

Figure 3:
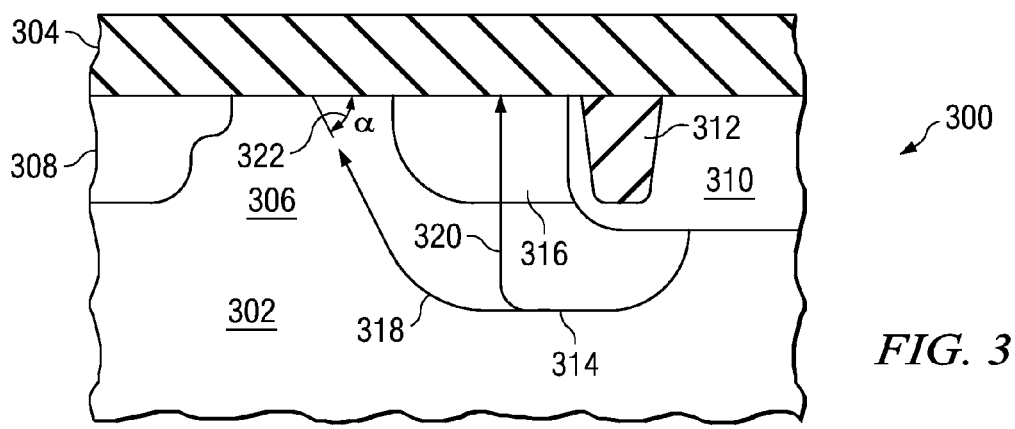
FIG. 3 provides an illustration depicting one embodiment of a semiconductor device design in accordance with certain aspects the present invention.

Other aspects of a system according to the present invention are illustrated now in reference to a semiconductor device segment 300, as depicted in FIG. 3. In this embodiment, generally, physical properties of available semiconductor materials and structures are manipulated to alter (i.e., reduce) conductivity of certain semiconductor regions or structures. To the extent that an electric field propagates through an altered area, the effective magnitude of the field is reduced in accordance with the present invention. The altered conductivity may also be employed to reduce the electric field incidence angles according to the present invention.

Again, for purposes of explanation and illustration, segment 300 is depicted and described as an NMOS type transistor segment. Segment 300 comprises a semiconductor substrate 302, upon which a gate oxide structure 304 is disposed. For purposes of explanation and illustration, only oxide 304 is shown in FIG. 3. A polysilicon gate, not shown, is disposed atop gate oxide. Substrate 302 comprises a channel region 306, doped as a P-type well. Substrate 302 further comprises a first terminal region 308, doped as N-type. In segment 300, region 308 functions as the transistor's source. Substrate 302 also comprises a second terminal region 310, doped as N-type. An electrical contact structure (not shown) is disposed atop an outer portion of region 310. In segment 300, region 310 functions as the transistor's drain. Again, segment 300 is fabricated in a small geometry CMOS transistor technology that utilizes a shallow trench isolation (STI) feature or structure 312 (e.g., isolation oxide) within device 300 to separate, for contact purposes, channel 306 (i.e., the gate structure) from the drain structure 310. Although this embodiment is particularly useful when oxide 304, for whatever reason (e.g., process constraints, performance considerations), is not laterally recessed from atop structure 312, it is not limited solely to such configurations, as is described in relation to further embodiments hereinafter.

When a high voltage is applied to the contact structure, and its voltage potential surpasses the voltage potential of the gate structure, an electric field 314 is induced within substrate 302—flowing generally from an area beneath the contact structure toward the portion of oxide 304 atop region 306. The intensity of field 314 varies proportionally with the voltage differential between the drain structure and the gate structure. As the voltage potential at the contact structure increases, the magnitude of field 314 increases. The heavy P-type doping of region 306 renders it significantly more conductive than structures 310 or 312—facilitating or augmenting the progress of field 314 through substrate 302. Again, field 314 typically flows along the most conductive path toward the drain structure and oxide 304.

In contrast to the previous embodiments, however, segment 300 is formed having a counter-doped region 316. Region 316 is disposed within region 306, near the surface of substrate 302 upon which oxide 304 is disposed, adjoining structure 310 or 312. Region 316 is doped with a material to render it less conductive than the remainder of region 306.

In one embodiment, region 316 is doped with N-type implant material (e.g., arsenic)—the opposite type material of the remainder of region 306. In alternative embodiments, other counter-dopants may be utilized in accordance with the present invention. In certain embodiments, region 316 may be formed utilizing a suitable implant technology. In other embodiments, region 316 may be formed on substrate 302 as other device features (e.g., regions 308, 310) are formed. For example, in one embodiment, masking may be altered during formation of region 310 such that region 316 is formed as a contiguous extension of region 310. In other embodiments, masking may be otherwise altered to form region 316 of a different configuration or composition. Regardless of which counter-doping material or configuration is utilized, region 316 is formed to be less conductive than the remainder of region 306.

As a result, the presence of region 316 either alters the path of field 314, as depicted by field component 318, or reduces its magnitude, as depicted by field component 320, as it approaches oxide 304. Where some field component 320 of field 314 propagates through region 316, its relative magnitude—as realized at oxide 304—is significantly reduced. The lower conductivity of region 316 diminishes the potential of the field such that only a fraction of field 314 arrives at oxide 304. The potential induced across oxide 304 by field 314 is therefore significantly lower than actual full potential of field 314. Where some field component 318 of field 314 propagates around region 316, the approach and penetration angle of field 318, with respect to oxide 304, is reduced from orthogonal or nearly orthogonal to some lesser, acute angle 322 ($\alpha$). As a result, only a fraction of field 314—the sin ($\alpha$) component of field 318—penetrates oxide 304 orthogonally.

The potential induced across oxide 304 by field 314 is therefore significantly lower than actual full potential of field 314. The resulting rate and extent of oxide degradation, due to field 314, is decreased dramatically or eliminated altogether.

As previously discussed, region 316 may be formed concurrently with, or subsequent to the formation of, structures 310 and 312. Region 316 may be formed by a single implant, or by a plurality of implants—concurrent or iterative in nature. Structurally, region 316 may abut structure 312 opposite structure 310. Where region 316 and structure 310 are formed of similar or compatible material, region 316 may be configured as an extension of structure 310—enveloping structure 312. Region 316 may be formed to have a variety of cross-sectional profiles, depending upon the limitations or requirements of a given process or design. Generally, a broader profile for region 316 will further reduce the sin ($\alpha$) component of field 314, reducing the portion of field 314 to which oxide 304 is exposed.

The present invention thus provides for limitation or obviation of oxide degradation due to internal electric fields, regardless of the ability to manipulate lateral oxide position within a given semiconductor fabrication technology. In certain other embodiments of the present invention, however, counter-doping and lateral oxide repositioning may be concurrently utilized—depending upon the particular semiconductor fabrication process—to optimize beneficial effects for a transistor.

Figure 4A:
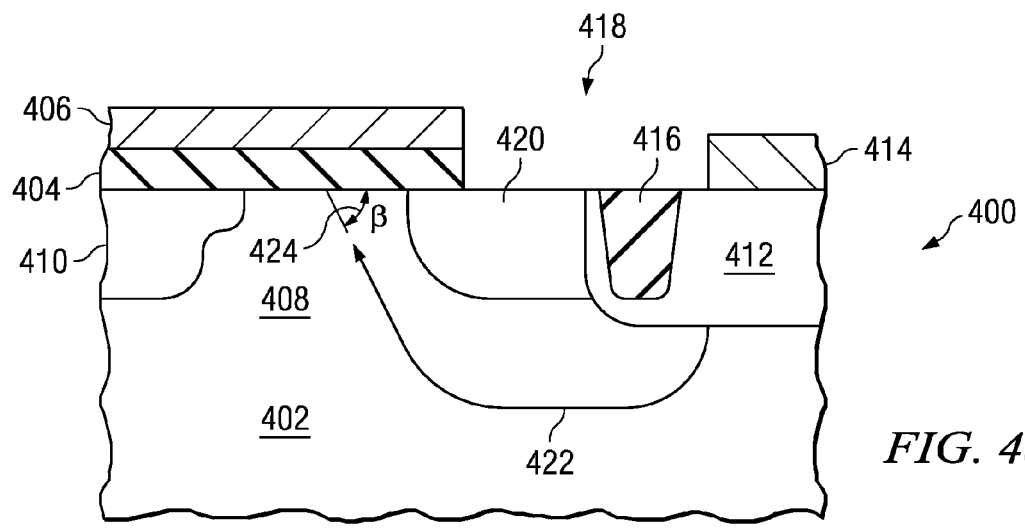
FIGS. 4a–4c provide illustrations depicting embodiments of a semiconductor device design that combine aspects of the present invention illustrated in reference to FIGS. 2 and 3.
Figure 4B:
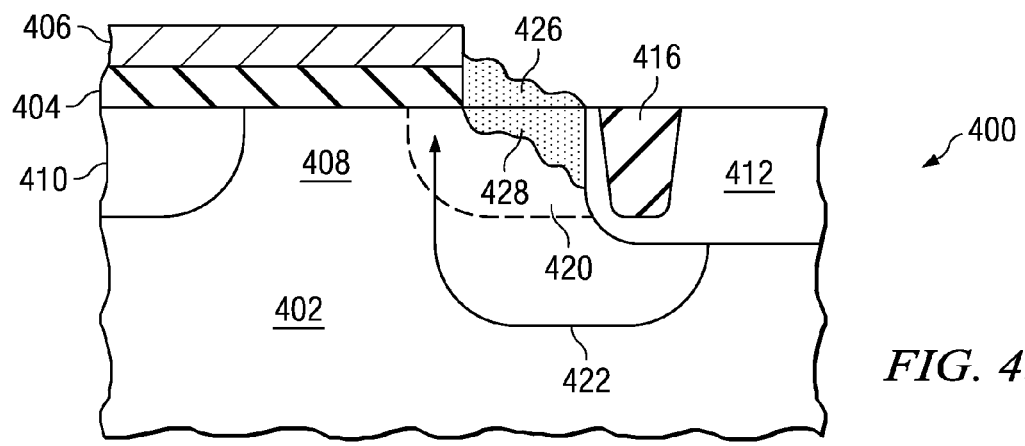
Figure 4C:
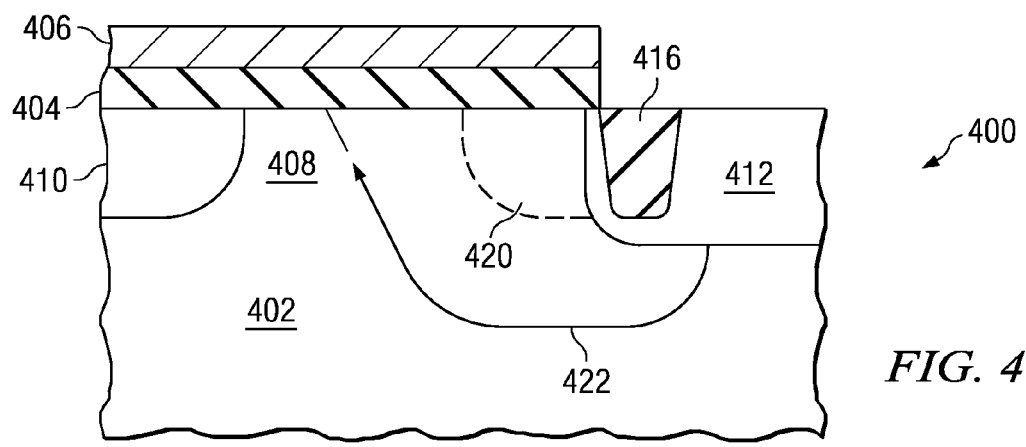

As such, several other embodiments of systems utilizing both counter-doping and lateral oxide repositioning according to the present invention are illustrated now in reference to FIGS. 4a–4c. FIG. 4a depicts a semiconductor device segment 400. Again, for purposes of explanation and illustration, segment 400 is depicted and described as an NMOS type transistor segment. Segment 400 comprises a semiconductor substrate 402, upon which a gate oxide structure 404 is disposed. A polysilicon gate 406 is disposed atop gate oxide 404. Substrate 402 comprises a channel region 408, doped as a P-type well.

Substrate 402 further comprises a first terminal region 410, doped as N-type. In segment 400, region 410 functions as the transistor's source. Substrate 402 also comprises a second terminal region 412, doped as N-type. An electrical contact structure 414 (e.g., metallic contact) is disposed atop an outer portion of region 412. In segment 400, region 412 and structure 414 function as the transistor's drain. Segment 400 is fabricated in a small geometry CMOS transistor technology that utilizes a shallow trench isolation (STI) feature or structure 416 (e.g., isolation oxide) within device 400 to separate, for contact purposes, channel 408 (i.e., the gate structure) from the drain structure 414.

Segment 400 is formed having oxide 404—and, correspondingly, poly 406—laterally recessed, in the direction of region 410, from atop structure 416. In the embodiment depicted by segment 400, oxide 404 is sufficiently recessed from atop structure 416 so as to form moat 418. As with other embodiment of the present invention, moat 418 may be provided utilizing any suitable semiconductor process (e.g., masking, etch) or combination of processes, and its size (i.e., breadth) may be varied.

Segment 400 also has a counter-doped region 420, formed near the surface of substrate 402, under moat 418 and oxide 404 and adjoining structure 412 or 416. Again, region 420 is doped with a material to render it less conductive than the remainder of region 408. When an electric field 422 is induced within substrate 402—flowing generally from an area beneath contact 414 toward the portion of oxide 404 atop region 408—its approach and penetration of oxide 404 is altered by both the positioning of oxide 404 and the presence of region 420. The angle 424 (β) at which field 422 approaches and penetrates oxide 404 is reduced from orthogonal or nearly orthogonal to some lesser, acute angle. As a result, only a small fraction of field 422—the sin (β) component of field 422—penetrates oxide 204 orthogonally. The result, as previously described, is a substantial or complete reduction in the rate and extent of oxide degradation due to field 422.

Depending upon the fabrication processes and materials utilized in manufacturing, moat 418 may be susceptible to the formation of a silicide 426 along its exposed surface, as depicted in FIG. 4b. If such a silicide were to form, it could alter 428 the behavioral properties of regions 408 and 420, and field 422, such that field 422 would approach oxide 404 on a more direct (i.e., more nearly orthogonal) path. The benefits of the present invention may still be realized in such an instance, only to a lesser extent. This issue may be obviated, however, in several simple ways. A number of semiconductor fabrication processes have silicide blocking mechanisms (e.g., structures, compounds, processes) readily available. Thus, a silicide blocking mechanism may be provided for moat 418 if the presence or effects of a silicide 426 unacceptably alter the benefits provided by the present invention.

Furthermore, other embodiments of segment 400 may be provided having oxide 404 abutting structure 416, as depicted now in FIG. 4c. Such a configuration obviates any silicide alteration 428 of the behavior of regions 408 and 420. Moat 418 is eliminated, and any silicide that may form above structure 416 would have no effective access to field 422.

Thus, the present invention provides a versatile system in which certain physical characteristics of semiconductor devices or structures are manipulated to significantly reduce or obviate the damaging effects of internally generated electric fields. Although illustrated and explained in reference to NMOS transistor structures, and particularly gate oxides therein, the present invention is also applicable to other device structures in NMOS, PMOS and other semiconductor technologies.

The present invention may be applied to any semiconductor device structure that suffers degradation caused by internally generated electric fields. Viable displacement of the device structure, altering certain physical properties of regions surrounding the device structure, or combinations thereof may be employed in accordance with the present invention to reduce field-induced degradation. Such measures are employed to reduce the magnitude with which an electric field approaches or penetrates a device structure—either by diminishing the field's effective magnitude or by reducing its approach angle—so that the device structure is only exposed to some fractional component of the field. The system of the present invention provides its benefits utilizing process-compatible manipulations of semiconductor feature composition, and relative positioning thereof. The present invention thereby reduces reliability issues associated with, and improves the operable lifetime of, certain low voltage semiconductor device technologies.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A low voltage semiconductor device segment comprising:
   a substrate;
   a channel region disposed along a first surface of the substrate;
   a terminal structure disposed along the first surface of the substrate;
   an isolation structure disposed along the first surface of the substrate, in between the channel region and the terminal structure; and
   an oxide structure, disposed atop the first surface of the substrate over the channel region;
   wherein the semiconductor device segment has a counter-doped region between the oxide structure and the isolation structure.

2. The semiconductor device segment of claim 1, wherein the semiconductor device segment also has a lateral recession of the oxide structure to abut the isolation structure.

3. A low voltage semiconductor device segment comprising:
   a substrate;
   a channel region disposed along a first surface of the substrate;
   a terminal structure disposed along the first surface of the substrate;
   an isolation structure disposed along the first surface of the substrate and within the terminal structure; and
   an oxide structure, disposed atop the first surface of the substrate over the channel region;
   wherein the semiconductor device segment has a lateral recession of the oxide structure to abut the isolation structure.

4. The semiconductor device segment of claim 3, wherein the semiconductor device segment also has a counter-doped region between the oxide structure and the isolation structure.

5. The semiconductor device segment of claim 1, wherein the semiconductor device segment also has a lateral recession of the oxide structure to form a moat between the oxide structure and the isolation structure.

6. A low voltage semiconductor device segment comprising:
   a substrate;
   a channel region disposed along a first surface of the substrate;
   a terminal structure disposed along the first surface of the substrate;
   an isolation structure disposed along the first surface of the substrate and within the terminal structure; and an oxide structure, disposed atop the first surface of the substrate over the channel region;

wherein the semiconductor device segment has a lateral recession of the oxide structure to form a moat between the oxide structure and the isolation structure.

7. The semiconductor device segment of claim 6, wherein the semiconductor device segment also has a counter-doped region between the oxide structure and the isolation structure.

* * * * *